United States Patent
Kanda et al.

(10) Patent No.: US 10,726,756 B2
(45) Date of Patent: Jul. 28, 2020

(54) DISPLAY DEVICE

(71) Applicant: Sharp Kabushiki Kaisha, Sakai, Osaka (JP)

(72) Inventors: Keisuke Kanda, Sakai (JP); Hiroaki Sugiyama, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/387,577

(22) Filed: Apr. 18, 2019

(65) Prior Publication Data
US 2019/0325797 A1 Oct. 24, 2019

(30) Foreign Application Priority Data
Apr. 19, 2018 (JP) .................. 2018-080393

(51) Int. Cl.
*G09G 3/00* (2006.01)
*G09G 3/36* (2006.01)
*H01L 27/12* (2006.01)
*G02F 1/1362* (2006.01)

(52) U.S. Cl.
CPC ....... *G09G 3/006* (2013.01); *G02F 1/136286* (2013.01); *G09G 3/3677* (2013.01); *H01L 27/124* (2013.01); *G09G 2300/0426* (2013.01); *G09G 2310/08* (2013.01)

(58) Field of Classification Search
CPC ...... G02F 1/136286; G09G 2300/0426; G09G 2310/08; G09G 3/006; G09G 3/3677; H01L 27/124
See application file for complete search history.

(56) References Cited

U.S. PATENT DOCUMENTS

| | | | |
|---|---|---|---|
| 2007/0063960 A1 | 3/2007 | Iida et al. | |
| 2013/0050159 A1* | 2/2013 | Wang | G09G 3/20 345/204 |
| 2014/0362042 A1* | 12/2014 | Noguchi | G09F 3/0412 345/174 |
| 2016/0307544 A1* | 10/2016 | Lin | G09G 5/363 |
| 2017/0169769 A1* | 6/2017 | Fletcher | G09G 3/3648 |
| 2018/0233077 A1* | 8/2018 | Fletcher | G09G 3/3674 |
| 2019/0237036 A1* | 8/2019 | Kurihara | G09G 3/006 |
| 2019/0253045 A1* | 8/2019 | Bacigalupo | H03K 17/0828 |
| 2019/0325797 A1* | 10/2019 | Kanda | G09G 3/3677 |

FOREIGN PATENT DOCUMENTS

JP 2007-72062 A 3/2007

* cited by examiner

*Primary Examiner* — Tony O Davis
(74) *Attorney, Agent, or Firm* — Keating & Bennett, LLP

(57) ABSTRACT

The display device includes a display panel, gate line driving circuitry that includes gate drivers provided for each of gate lines, a control circuit, and a signal processing circuit. The control circuit supplies a control signal to at least one gate driver corresponding to a gate line to be scanned first in a unit period in which the gate lines are scanned. The gate driver which received the control signal is driven on the basis of the control signal, and the gate drivers in subsequent stages are each driven on the basis of a scanning signal of the gate driver in a preceding stage. The signal processing circuit outputs, on the basis of a scanning signal of at least one gate driver corresponding to a gate line to be scanned last in the unit period and the control signal, a detection signal that indicates whether the gate driver is normal.

8 Claims, 8 Drawing Sheets

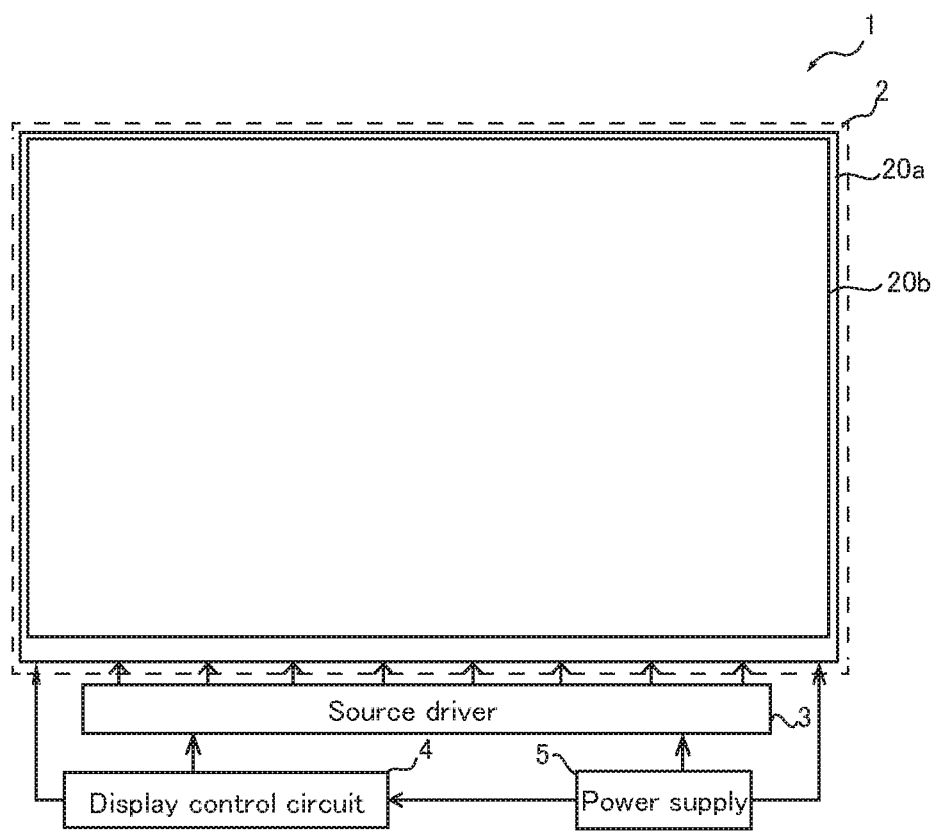
F I G. 1
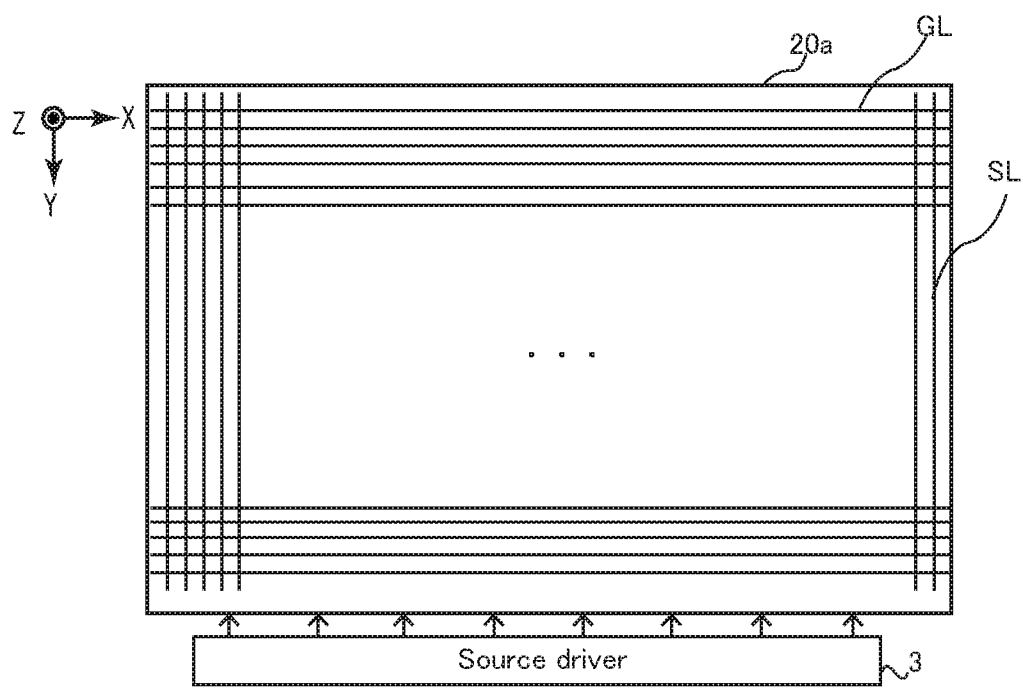
F I G. 2

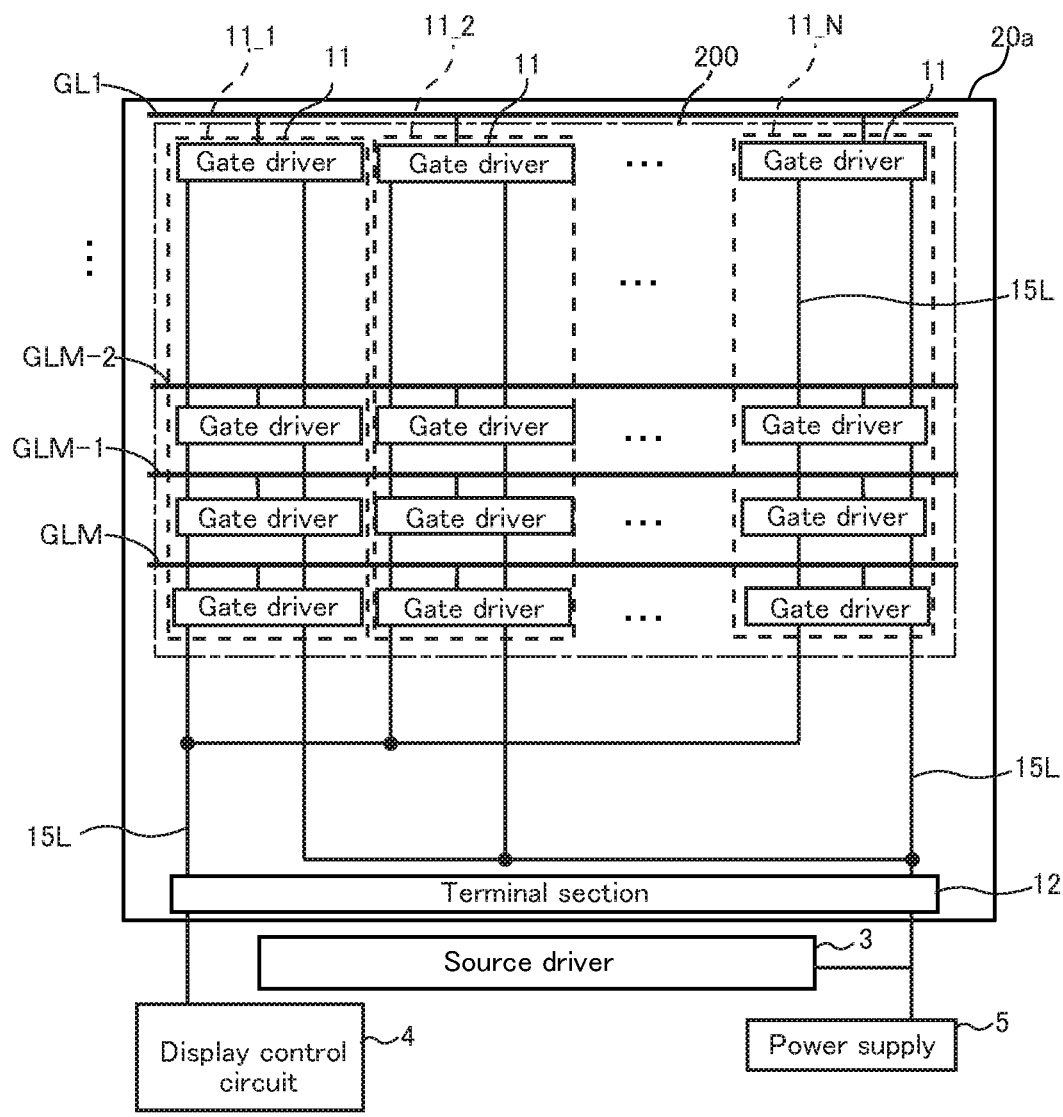
F I G. 3

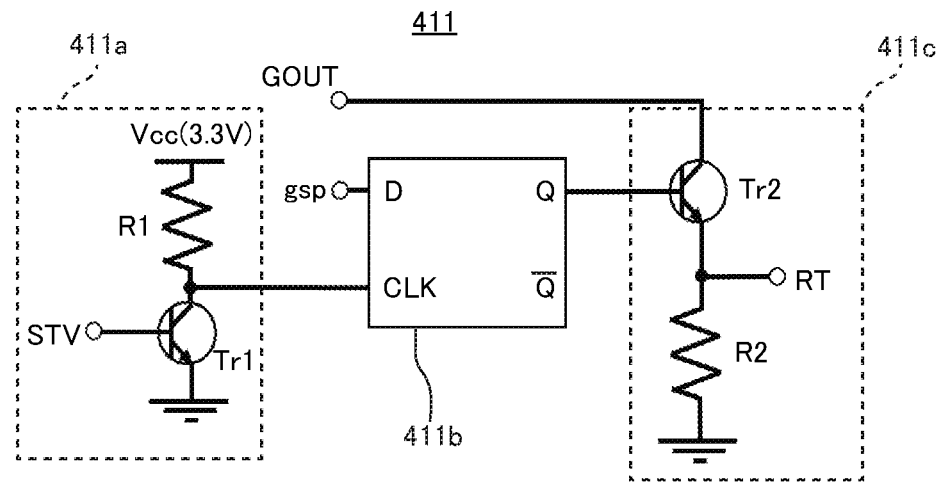
F I G. 5
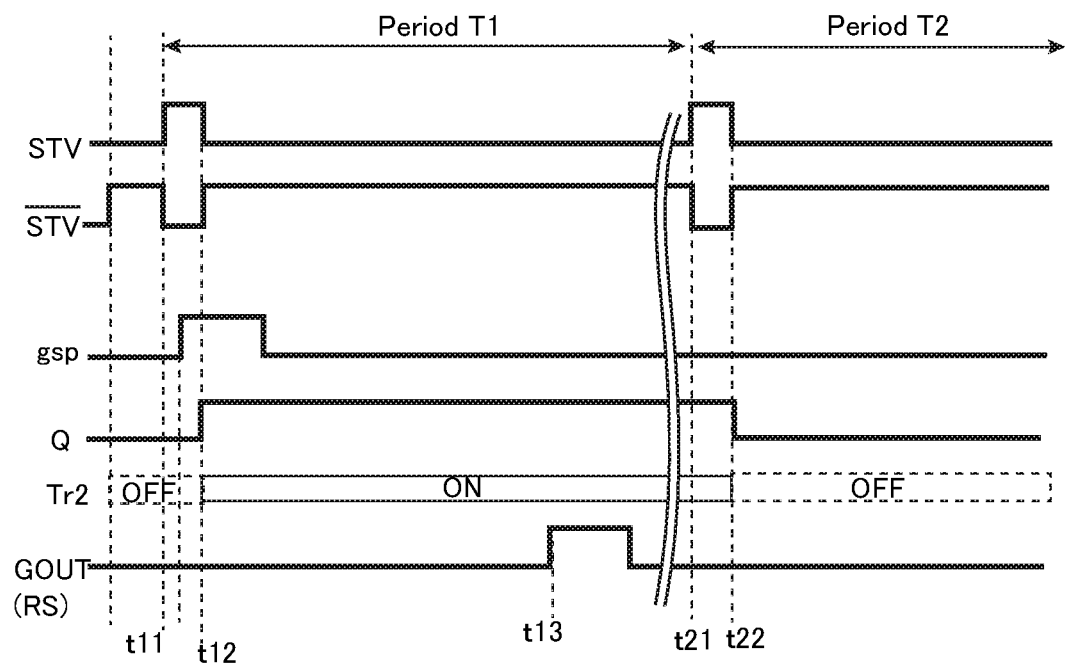
F I G. 6

DISPLAY DEVICE

BACKGROUND OF THE INVENTION

1. Field of the Invention

The present invention generally relates to a display device, and more particularly, a display device configured to detect operation errors of gate drivers provided in a display region.

2. Description of Related Art

Conventionally, a display device is known that includes pixels arranged in a matrix and displays an image by selecting these pixels row by row. Japanese patent publication No. 2007-72062 (hereinafter referred to as JP 2007-72602 A) discloses such a display device. In this display device, gate drivers, each of which selects pixels in one row and supplies a driving signal (selection signal) to the pixels, are disposed outside a display region (disposed in the so-called frame region).

As described in JP 2007-72062 A, it has been common to dispose gate drivers in a frame region. However, in recent years, a configuration in which all or at least some of circuit elements constituting the gate drivers are disposed in the display region is also known. In such a configuration, a plurality of gate drivers may be provided for one gate line, and the gate drivers may be driven while switching the drive mode between a drive mode in which one or some of the gate drivers is/are driven alternately and a drive mode in which all the gate drivers are driven. In this case, it is necessary to more reliably detect whether each of the gate drivers is operating normally.

With the foregoing in mind, it is an object of the present invention to provide a display device that can detects operation errors of gate drivers more reliably in a configuration in which at least some of circuit elements constituting the gate drivers are disposed in a display region.

SUMMARY OF THE INVENTION

In order to achieve the above object, a display device according to the present invention includes a display pane that includes a plurality of gate lines and a plurality of source lines; gate line driving circuitry that includes a plurality of gate drivers provided for each of the plurality of gate lines; a control circuit that controls the gate line driving circuitry; and a signal processing circuit that is provided between the gate line driving circuitry and the control circuit. At least some of circuit elements constituting the plurality of gate drivers provided for each of the plurality of gate lines are provided in a display region of the display panel. The control circuit supplies a control signal that indicates a gate line scanning timing to at least one of the plurality of gate drivers corresponding to, among the plurality of gate lines, a gate line to be scanned first in a unit period in which the plurality of gate lines are scanned. In the gate line driving circuitry, the gate driver to which the control signal has been supplied is driven on the basis of the control signal, and the gate drivers in stages subsequent to the gate driver to which the control signal has been supplied are each driven on the basis of a scanning signal of the gate driver in a stage preceding thereto. The signal processing circuit outputs, on the basis of a scanning signal of at least one of the plurality of gate drivers corresponding to, among the plurality of gate lines, a gate line to be scanned last in the unit period and the control signal, a detection signal that indicates whether the gate driver is operating normally.

According to the configuration of the present invention, in a display device configured such that at least some of circuit elements constituting gate drivers are disposed in a display region, operation errors of the gate drivers can be detected more reliably.

BRIEF DESCRIPTION OF THE DRAWINGS

FIG. 1 shows a schematic configuration of a liquid crystal display device according to a first embodiment.

FIG. 2 is a top view showing a schematic configuration of an active matrix substrate shown in FIG. 1.

FIG. 3 is another top view showing the schematic configuration of the active matrix substrate shown in FIG. 1.

FIG. 5 shows an example of a circuit configuration of an output control circuit shown in FIG. 4.

FIG. 6 is a timing chart illustrating an operation of the output control circuit shown in FIG. 5.

DETAILED DESCRIPTION OF THE INVENTION

Figure 4:
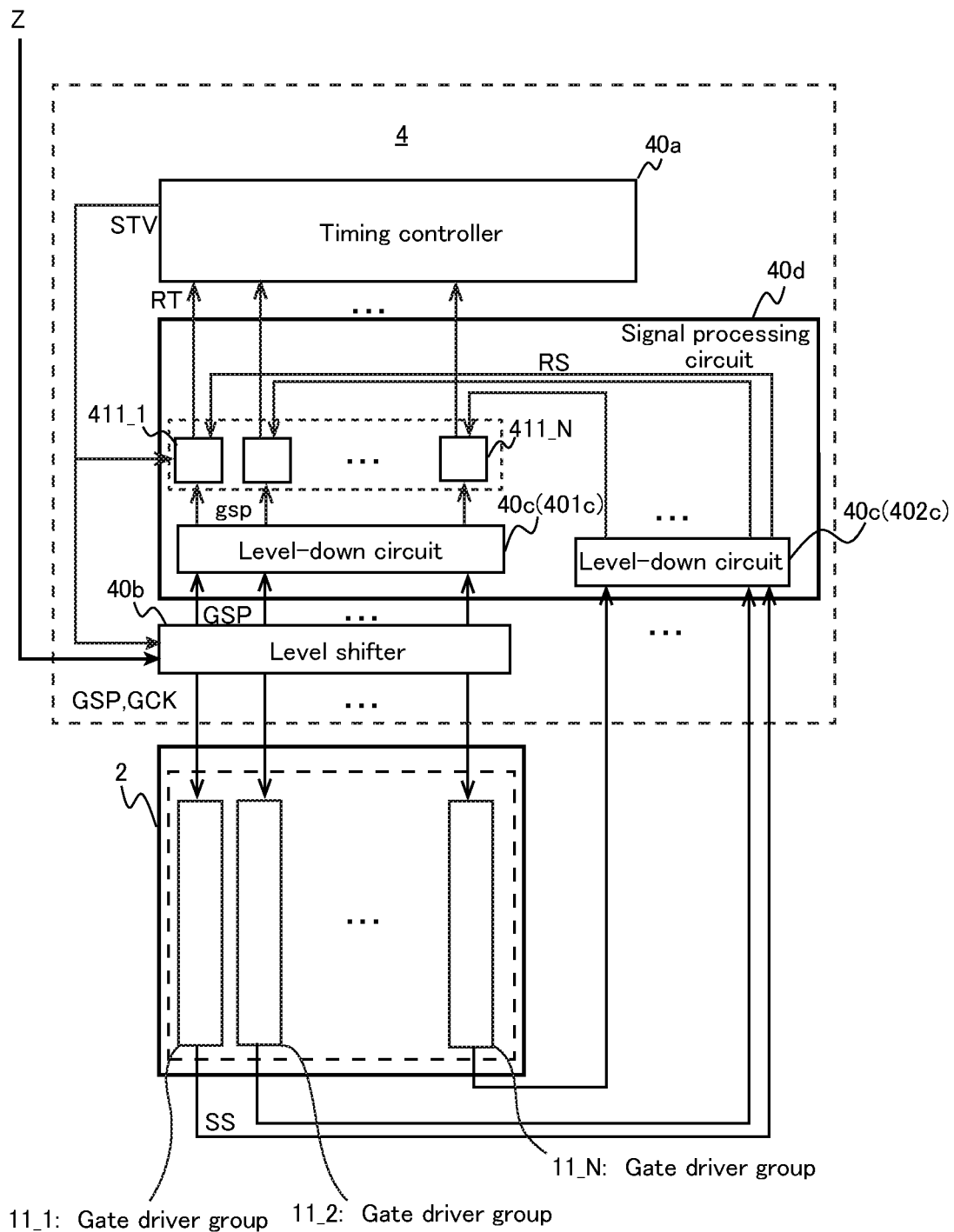
FIG. 4 is a block diagram showing a display control circuit and a display panel shown in FIG. 3.

A display device according to one embodiment of the present invention is a display device including: a display pane that includes a plurality of gate lines and a plurality of source lines; gate line driving circuitry that includes a plurality of gate drivers provided for each of the plurality of gate lines; a control circuit that controls the gate line driving circuitry; and a signal processing circuit that is provided between the gate line driving circuitry and the control circuit, wherein at least some of circuit elements constituting the plurality of gate drivers provided for each of the plurality of gate lines are provided in a display region of the display panel, the control circuit supplies a control signal that indicates a gate line scanning timing to at least one of the plurality of gate drivers corresponding to, among the plurality of gate lines, a gate line to be scanned first in a unit period in which the plurality of gate lines are scanned, in the gate line driving circuitry, the gate driver to which the control signal has been supplied is driven on the basis of the control signal, and the gate drivers in stages subsequent to the gate driver to which the control signal has been supplied are each driven on the basis of a scanning signal of the gate driver in a stage preceding thereto, and the signal processing circuit outputs, on the basis of a scanning signal of at least one of the plurality of gate drivers corresponding to, among the plurality of gate lines, a gate line to be scanned last in the unit period and the control signal, a detection signal that indicates whether the gate driver is operating normally (first configuration).

According to the first configuration, the display device includes the gate line driving circuitry that includes the plurality of gate drivers provided for each of the gate lines, and at least some of the circuit elements constituting the plurality of gate drivers provided for each of the gate lines are provided in the display region. The control circuit supplies the control signal that indicates the gate line scanning timing to at least one gate driver corresponding to the gate line to be scanned first, and the gate driver is driven on the basis of the control signal. The gate drivers in the stages subsequent to the gate driver to which the control signal has been supplied are each driven on the basis of the scanning signal of the gate driver in the stage preceding thereto. The signal processing circuit outputs, on the basis of the scanning signal of the at least one gate driver corresponding to the gate line to be scanned last and the control signal, the detection signal that indicates whether the gate driver is operating normally. With this configuration, whether the gate drivers are operating properly can be detected reliably on the basis of the detection signal.

In the first configuration, the control circuit may have a first drive mode in which, for each of the gate lines, one or some of the plurality of gate drivers corresponding to the gate line is/are driven in the unit period and a second drive mode in which, for each of the gate lines, all the plurality of gate drivers corresponding to the gate line are driven in the unit period, and the first drive mode and the second drive mode may be switched for every unit period or for every two or more unit periods (second configuration).

According to the second configuration, the first drive mode in which, for each of the gate lines, one or some of the gate drivers corresponding to the gate line is/are driven and the second drive mode in which, for each of the gate lines, all the gate drivers corresponding to the gate line are driven are switched for every unit period or for every two or more unit periods. With this configuration, power consumption when driving the gate lines can be reduced, and also, deterioration of the circuit elements constituting the gate drivers can be suppressed.

In the second configuration, the control circuit may change, among the plurality of gate drivers provided for each of the gate lines, a gate driver to be driven in the first drive mode for every unit period or for every two or more unit periods (third configuration).

According to the third configuration, the gate driver(s) to be driven in the first drive mode is changed for every unit period or for every two or more unit periods. With this configuration, deterioration of the circuit elements constituting the gate drivers can be decreased.

In the first drive mode in the second or third configuration, the signal processing circuit may output, on the basis of scanning signals of all the plurality of gate drivers corresponding to the gate line to be scanned last in the unit period and the control signal, a signal that indicates whether the gate drivers not to be driven are normal as the detection signal (fourth configuration).

According to the fourth configuration, it is possible to detect whether not only the gate driver to be driven but also the gate drivers not to be driven are normal on the basis of the detection signal.

In any of the first to fourth configurations, the display device may be configured such that the signal processing circuit further includes a booster circuit that outputs a boosted signal obtained by boosting a voltage of the control signal to a predetermined voltage to the gate drivers corresponding to the gate line to be scanned first, and a step-down circuit that outputs a step-down signal obtained by stepping down a voltage of a scanning signal of at least one of the plurality of gate drivers corresponding to the gate line to be scanned last, and the signal processing circuit outputs the detection signal on the basis of the step-down signal and the control signal (fifth configuration).

According to the fifth configuration, input/output signals of the gate drivers can be controlled to appropriate voltages.

Embodiments of the present invention will be described in detail below with reference to the drawings. Components that are identical or equivalent to each other in the drawings are given the same reference numerals, and descriptions thereof are not repeated.

First Embodiment

Configuration of Liquid Crystal Display Device

FIG. 1 is a schematic view showing a schematic configuration of a liquid crystal display device according to the present embodiment. The liquid crystal display device 1 includes a display panel 2, a source driver 3, a display control circuit 4, and a power supply 5. The display panel 2 includes an active matrix substrate 20a, a counter substrate 20b, and a liquid crystal layer (not shown) interposed between these substrates. Although not shown in FIG. 1, polarizing plates are provided on the lower surface side of the active matrix substrate 20a and on an upper surface of the counter substrate 20b. On the counter substrate 20b, color filters and a common electrode (both not shown) are formed.

As shown in FIG. 1, the active matrix substrate 20a is connected to the source driver 3 formed on a flexible substrate. The display control circuit 4 is electrically connected to the display panel 2, the source driver 3, and the power supply 5. The display control circuit 4 outputs control signals to the source driver 3 and gate drivers to be described below. The control signals include a reset signal for displaying an image on the display panel 2, which is responsive to an image signal and a timing signal inputted from the outside, a clock signal, a data signal, and a gate start pulse that indicates a gate line scanning timing. The power supply 5 is electrically connected to the display panel 2, the source driver 3, and the display control circuit 4, and supplies a power supply voltage signal to each of them.

Configuration of Active Matrix Substrate

FIGS. 2 and 3 are top views each showing a schematic configuration of the active matrix substrate 20a of the display panel 2. As shown in FIGS. 2 and 3, on the active matrix substrate 20a, a plurality of gate lines GL are formed in parallel with each other along one direction (the X direction in FIG. 2) on the active matrix substrate 20a. Although not shown in FIG. 3, a plurality of source lines SL are formed so as to cross the gate lines GL as shown in FIG. 2. A region surrounded by the gate lines GL and the source lines SL constitutes one pixel. A region where the pixels are formed serves as a display region of the display panel 2.

In the vicinity of the intersection of the gate line GL and the source line SL, a thin film transistor (hereinafter referred to as pixel TFT) (not shown) is provided. The pixel TFT is configured such that a gate thereof is connected to the gate line GL, a source thereof is connected to the source line SL, and a drain thereof is connected to a pixel electrode (not shown).

The gate lines GL are selected (scanned) one by one by gate drivers to be described below. The pixel TFT connected to the selected gate line GL is turned ON, and a pixel signal corresponding to the gradation to be displayed is supplied from the source line SL. In this manner, the respective pixels display desired gradations.

The number of the gate lines provided on the display panel 2 is M. As shown in FIG. 3, the respective gate lines are referred to as GL1, GL2, ..., and GLM. For the sake of convenience of explanation, the side on which GL1 is disposed is referred to as an upper side of the display panel 2, and a side on which GLM is disposed is referred to as a lower side of the display panel 2.

As shown in FIG. 3, gate drivers 11 are provided between adjacent gate lines GL in the display region of the active matrix substrate 20a. Although each gate driver 11 is illustrated as one block in FIG. 3, an actual gate driver 11 is not provided at one place in the form like an integrated circuit, and a plurality of circuit elements (such as a transistor) constituting the gate driver 11 are disposed so as to be distributed over the pixel region.

As shown in FIG. 3, in the present embodiment, in the display region 200, for each of the M gate lines GL, N gate drivers 11 (N: an integer of two or more) for driving the gate line GL are disposed. The gate drivers 11 for driving one gate line GL are connected to the gate drivers 11 for driving another adjacent gate line GL via signal wires 15L, respectively. The N gate drivers 11 connected to each other via the signal wire 15L and disposed along the direction in which the source lines SL extend is referred to as a gate driver group. In this example, the M×N gate drivers 11 are divided into gate driver groups 11_1 to 11_N. Hereinafter, the gate driver groups are referred to as the gate driver groups 11_n when differentiation among the gate driver groups 11_1 to 11_N is not necessary.

The display control circuit 4 operates the gate driver groups 11_1 to 11_N either in a full drive mode or in an alternating drive mode.

The full drive mode is a mode in which the gate driver groups 11_1 to 11_N are all driven, and a selection voltage (scanning voltage) with a high (H) level potential is supplied sequentially to the gate lines GL.

The alternating drive mode is a mode in which, among the gate driver groups 11_1 to 11_N, freely-selected one or some of the gate driver groups is/are driven, and a selection voltage with an H level potential is supplied sequentially to the gate lines GL by the gate driver group(s) to be driven while the driving of the gate driver(s) not to be driven is paused.

The display control circuit 4 switches the drive mode between the full drive mode and the alternating drive mode for every one frame or for every two or more frames, and drives the gate drivers 11 in the gate driver group(s) to be driven according to the drive mode.

In the present embodiment, the gate driver groups are driven in the alternating drive mode in a certain frame period, for example. The gate driver group to be operated in this frame period is, for example, the gate driver group 11_1, and the driving of the other gate driver groups is paused. The gate driver group to be operated in the alternating drive mode may be switched for every one frame period or for every two or more frame periods. That is, for example, for every one frame period, the gate driver group to be driven may be switched in such a manner that the gate driver group 11_1, the gate driver group 11_2, the gate driver group 11_3, and . . . are driven sequentially in this order.

By operating the gate driver groups in the alternating drive mode as described above, power consumption when driving the gate lines GL can be reduced as compared with the case of the full drive mode, and besides, deterioration of the circuit elements constituting the gate drivers 11 can be decreased. Furthermore, by changing the gate driver group(s) to be operated in the alternating drive mode for every one frame unit or for every two or more frame units, deterioration of the circuit elements constituting the gate drivers of the respective gate driver groups can be decreased as compared with the case where the same gate driver group(s) is operated continuously.

The control signals, power supply voltage signals, and the like outputted from the display control circuit 4 and the power supply 5 are inputted to a terminal section 12. The terminal section 12 is provided outside the display region. The signals inputted to the terminal section 12 are supplied to the respective gate drivers 11 via the signal wires 15L. The signal wires 5L are formed substantially in parallel with the source lines SL.

In the case of the full drive mode, the display control circuit 4 outputs a gate start pulse GSP via the terminal section 12 to, among the gate drivers 11 in the gate driver groups 11_1 to 11_N, all the gate drivers 11 corresponding to the gate line GL1 to be scanned first in the frame period. In this example, the gate start pulse is a high voltage signal whose voltage has been boosted by a booster circuit to be described below.

The gate drivers 11 in the gate driver groups 11_1 to 11_N connected to the gate line GL1 are driven on the basis of the gate start pulse GSP and the control signals such as the clock signal (OCR). Then, the gate drivers 11 in the gate driver groups 11_1 to 11_N connected to the gate line GL1 supply selection signals SS for switching the gate line GL1 to a selected state substantially simultaneously.

Upon receipt of the selection signals SS supplied to the preceding gate line GL1, the gate drivers 11 connected to the gate line GL2 are driven on the basis of the clock signal (OCR) and the like inputted from the display control circuit 4 to the terminal section 12, and supply selection signals SS to the gate line GL2. The gate line GL3 and gate lines subsequent thereto are also driven in the same manner. That is, the gate drivers 11 that drive the gate line GL3 and gate lines subsequent thereto are driven upon receipt of the potential of the selection signals SS supplied to the gate line GL preceding to the gate line GL scanned by these gate drivers 11.

After the gate drivers 11 have outputted the selection signals SS to the corresponding gate line GL, the respective gate drivers 11 output voltage signals with an L level potential (non-selection voltages) upon the lapse of the scanning period of the gate line GL, thereby switching the gate line GL to a non-selected state.

In the case of the alternating drive mode, the display control circuit 4 outputs a gate start pulse GSP via the terminal section 12 to, among the gate drivers 11 in the gate driver group 11_1 to be driven, the gate driver 11 corresponding to the gate line GL1 to be scanned first in the frame period. On the other hand, the display control circuit 4 does not output a gate start pulse to the gate driver groups not to be driven.

The gate driver 11 corresponding to the gate line GL1 in the gate driver group 11_1 is driven on the basis of the gate start pulse GSP and the control signals such as the clock signal and supplies a selection signal SS with an H level potential to the gate line GL1. Each of the gate drivers 11 corresponding to the gate line GL2 and gate lines subsequent thereto in the gate driver group 11_1 is driven upon receipt of a selection signal SS supplied to the preceding gate line GL and outputs a selection signal SS to the corresponding gate line GL. After each of the gate drivers 11 in the gate driver group 11_1 has outputted the selection signal SS to the corresponding gate line GL, each of the gate drivers 11 outputs a voltage signal with an L level potential (non-selection voltage) upon the lapse of the scanning period of the gate line GL, thereby switching the gate line GL to a non-selected state.

FIG. 4 is a block diagram showing the display control circuit 4 and the display panel 2 extracted from the display device 1. As shown in FIG. 4, the display control circuit 4 includes a timing controller 40a, a level shifter (booster circuit) 40b, and a signal processing circuit 40d that includes level-down circuits 40c (401c, 402c) and output control circuits 411. The level shifter 40b and the signal processing circuit 40d can be provided between the timing controller 40a and the display panel 2 and outside the display panel 2 (for example, on the flexible substrate).

The timing controller 40a is connected to the level shifter 40b and the signal processing circuit 40d. The timing controller 40a outputs, for example, a low voltage timing signal STV with an amplitude of 3.3 V (0 V to +3.3 V) to the level shifter 40b and the signal processing circuit 40d.

The level shifter 40b acquires a drive mode signal Z that indicates the alternating drive mode or the full drive mode from an external circuit (not shown). The drive mode signal Z is, for example, a signal whose potential is at an H level when it indicates the alternating drive mode and whose potential is at an L level as a result of inverting the potential in the case of the alternating drive mode when it indicates the full drive mode.

The timing controller 40a receives from the signal processing circuit 40d a feedback signal RT (detection signal) that indicates whether the gate driver groups operate in accordance with the drive mode.

The level shifter 40b outputs, as a gate start pulse GSP, a signal obtained by boosting the voltage of the low voltage timing signal STV outputted from the timing controller 40a to the gate driver group(s) to be driven, on the basis of the drive mode signal Z inputted from the external circuit (not shown). The gate start pulse GSP is, for example, a high voltage signal with an amplitude of 28 V (+21 V to −7 V). The gate start pulse GSP is generated by subjecting the timing signal STV to timing adjustment in accordance with the drive timing of the gate drivers and amplification by the level shifter 40b.

When the drive mode signal Z indicates the full drive mode, the level shifter 40b outputs the gate start pulse GSP to all the gate drivers 11 to be operated first in the gate driver groups 11_1 to 11_N. When the drive mode signal Z indicates the alternating drive mode, the level shifter 40b outputs the gate start pulse GSP to the gate driver 11 to be operated first in the gate driver group 11_1 to be driven, for example.

In this example, in the case of the alternating drive mode, among the N gate driver groups, one or some of them is pre-set as the gate driver group(s) to be driven. However, the level shifter 40b may receive an instruction specifying the gate driver group(s) to be driven from the external circuit (not shown).

The level-down circuit 401c outputs a low voltage signal (referred to as "gate start pulse gsp" hereinafter) obtained by stepping down the voltage of the gate start pulse GSP outputted from the level shifter 40b to the corresponding output control circuits 411.

The level-down circuit 402c is connected to, among the gate drivers 11 in the gate driver groups 11_1 to 11_N, N gate drivers 11 provided for the gate line GL to be scanned last (these N gate drivers 11 are referred to as "last-stage gate drivers" hereinafter). Selection signals SS outputted from the respective last-stage gate drivers 11 when they scan the gate line GL are high voltage signals with a voltage level equivalent to that of the gate start pulse GSP. The level-down circuit 402c steps down the voltages of the high voltage selection signals SS outputted from the respective last-stage gate drivers 11 to, for example, a predetermined low voltage (e.g., about 0 V to +3.3 V), and then, outputs them to the signal processing circuit 40d as feedback signals RS. Similarly to the timing signal STV, the feedback signals RS are also low voltage signals with an amplitude of 3.3 V (0 V to +3.3 V), for example.

The output control circuits 411 (411_1 to 411_N) are provided for the respective N gate driver groups. Each of the output control circuits 411 is connected to the level-down circuit 401c, and receives the gate start pulse gsp obtained by stepping down the voltage of the gate start pulse GSP for the corresponding gate driver group. That is, to the output control circuit 411 corresponding to the gate driver group to be driven, the gate start pulse gsp is supplied from the level-down circuit 401c.

For every one frame, each output control circuit 411 outputs a detection signal RT that indicates whether the gate driver group corresponding to each output control circuit 411 is operating normally to the timing controller 40a, on the basis of the gate start pulse and the feedback signal RS from the last-stage gate driver 11 in the gate driver group.

An example of a specific circuit configuration of the output control circuit 411 is shown in FIG. 5. As shown in FIG. 5, the output control circuit 411 includes a NOT circuit 411a, a D flip-flop circuit 411b, and a switch circuit 411c.

The NOT circuit 411a includes a transistor Tr1 and a resistor R1. The transistor Tr1 is an NPN bipolar transistor. A base of the transistor Tr1 is connected to an STV terminal, and a collector of the transistor Tr1 is connected to one end of the resistor R1 and to a CLK terminal of the D flip-flop circuit 411b. The other end of the resistor R1 is connected to a low (e.g., about 3 V) power-supply voltage Vcc. An emitter of the transistor Tr1 is grounded. The STV terminal is connected to the timing controller 40a, and a timing signal STV is inputted from the timing controller 40a.

A D terminal of the D flip-flop circuit 411b is connected to the level-down circuit 401c. To the D terminal, a gate start pulse gsp obtained by stepping down the voltage of the same gate start pulse GSP as that for the corresponding gate driver group is inputted. The CLK terminal of the D flip-flop circuit 411b is connected between the resistor R1 and the transistor Tr1 of the NOT circuit 411a. A Q terminal of the D flip-flop circuit 411b is connected to the switch circuit 411c.

The switch circuit 411c includes a transistor Tr2 and a resistor R2. The transistor Tr2 is an NPN bipolar transistor. A base of the transistor Tr2 is connected to the Q terminal of the D flip-flop circuit 411b, and a collector of the transistor Tr2 is connected to a GOUT terminal. The GOUT terminal is connected to the last-stage gate driver 11 in the driver group corresponding to the output control circuit 411 via the level-down circuit 402c. The voltage of selection signal SS outputted from the last-stage gate driver 11 is stepped down by the level-down circuit 402c, as a result, a feedback signal RS is generated. The feedback signal RS is inputted to the GOUT terminal. An emitter of the transistor Tr2 is connected to one end of the resistor R2, and the other end of the resistor R2 is grounded.

An RT terminal is connected between the transistor Tr2 and the resistor R2. The RT terminal is connected to the timing controller 40a, and an output signal from the RT terminal is inputted to the timing controller 40a as the feedback signal RT of the gate driver group.

Next, operations of the respective components of the output control circuit 411 will be described. In the NOT circuit 411a, the transistor Tr1 is turned ON when a timing signal STV with an H level potential is inputted from the STV terminal, and an inverted signal obtained by inverting the potential of the timing signal STV is inputted to the CLK terminal of the D flip-flop circuit 411b.

When the inverted signal of the timing signal STV is inputted to the CLK terminal of the D flip-flop circuit 411b, the D flip-flop circuit 411b outputs the gate start pulse gsp inputted from the Q terminal to the D terminal at a timing when the potential of the inverted signal shifts to an H level.

In the switch circuit 411c, the transistor Tr2 is turned ON when a gate start pulse gsp with an H level potential is inputted to the base, and a selection signal SS inputted to the collector is outputted as a feedback signal RT of the corresponding gate driver group. When the potential of the gate start pulse is at an L level, the transistor Tr2 is in an OFF state, and a signal that indicates a ground potential is outputted as a feedback signal RT of the corresponding gate driver group.

FIG. 6 is a timing chart illustrating an example of an operation of the output control circuit 411_1 corresponding to the gate driver group 11_1. In FIG. 6, a period T1 (frame) is a driving period of the gate driver group 11_1, and a period T2 (frame) is a driving pause period of the gate driver group 11_1. In this case, during the period T1, a gate start pulse GSP is supplied from the level shifter 40b to the gate driver group 11_1, and a gate start pulse gsp is supplied from the level-down circuit 401c to the output control circuit 411_1. During the period T2, the level shifter 40b and the level-down circuit 401c do not supply a gate start pulse GSP and a gate start pulse gsp, respectively. This will be described specifically below.

At a timing t11 in the period T1, a timing signal STV with an H level potential is supplied from the timing controller 40a for a predetermined clock period only.

The NOT circuit 411a of the output control circuit 411_n inverts the timing signal STV outputted from the timing controller 40a, and inputs the thus-obtained inverted signal to the CLK terminal of the D flip-flop circuit 411b.

The voltage of the timing signal STV is boosted by the level shifter 40b, and the thus-obtained boosted signal is outputted as a gate start pulse GSP to the gate driver group 11_1 to be driven and to the level-down circuit 401c. The voltage of the gate start pulse GSP outputted to the level-down circuit 401c is stepped down, and the thus-obtained step-down signal is inputted as a gate start pulse gsp to the D flip-flop circuit 411b of the output control circuit 411_n.

The D flip-flop circuit 411b captures the gate start pulse gsp from the D terminal at a timing t12 when the potential of the inverted signal inputted to the CLK terminal shifts from an L level to an H level, and outputs from the Q terminal a voltage signal (H level or L level) that indicates the presence or absence of the gate start pulse gsp.

The transistor Tr2 of the switch circuit 411c is turned ON at the timing t12. At a timing t13 when the feedback signal RS obtained by stepping down the voltage of the selection signal SS from the last-stage gate driver 11 in the gate driver group 11_1 is inputted to the GOUT terminal, the switch circuit 411c outputs the feedback signal RS as a feedback signal RT of the gate driver group 11_1.

The timing controller 40a outputs a timing signal STV with an H level potential at the start timing t21 of the subsequent period T2. The NOT circuit 411a of the output control circuit 411_1 inputs an inverted signal of this timing signal STV to the CLK terminal of the D flip-flop circuit 411b.

In a period from the timing t12 in the period T1 to a timing t22 at which the potential of the inverted signal of the timing signal STV shifts from an L level to an H level in the period T2, the D flip-flop circuit 411b outputs from the Q terminal the gate start pulse gsp captured at the timing t12. The transistor Tr2 of the switch circuit 411c maintains the ON state during the period from the timing t12 to the timing t22.

In the period T2, the gate driver group 11_1 is in a driving pause period. Thus, a gate start pulse GSP with an L level potential is supplied from the level shifter 40b to the gate driver group 11_1, and a gate start pulse gsp with an L level potential is supplied from the level-down circuit 401c to the output control circuit 411_1. Accordingly, at the timing t22, a voltage signal with an L level potential is outputted from the Q terminal of the D flip-flop circuit 411b, and the transistor Tr2 is turned OFF. Moreover, in this example, a selection signal SS with an H level potential is not outputted from the last-stage gate driver 11 in the gate driver group 11_1. Accordingly, a feedback signal RS with an H level potential is not outputted from the level-down circuit 402c, and thus, a feedback signal RT that indicates a ground potential is outputted from the RT terminal.

As described above, in the above example, the last-stage gate driver 11 in the gate driver group 11_1 which received the gate start pulse GSP outputs the selection signal SS, and only the feedback signal RS obtained by stepping down the voltage of the selection signal SS is inputted to the timing controller 40a as the feedback signal RT. Therefore, it is possible to detect whether the gate driver group to be driven is operating normally.

Second Embodiment

According to the above-described first embodiment, it is possible to detect whether a gate driver group(s) to be driven to which a gate start pulse GSP has been inputted is operating properly. However, it is not possible to detect whether gate driver groups not to be driven are in a normal state.

That is, according to the configuration of the output control circuit 411 shown in FIG. 5, in the case where a gate start pulse gsp is not supplied to the output control circuit 411, the transistor Tr2 is always in an OFF state. Accordingly, the feedback signal RT has a ground potential regardless of the potential of the GOUT terminal, and therefore, it is not possible to detect whether the gate driver groups not to be driven are normal. Specifically, when a feedback signal RS inputted to the GOUT terminal is a signal which obtained by stepping down the voltage of a selection signal SS from a last-stage gate driver 11 in a gate driver group not to be driven, it is not possible to detect that the operation of the gate driver group is abnormal. Possible causes of such malfunction of the gate driver group include short-circuiting in the wiring on the display panel and destruction of switching elements on the display panel owing to static electricity (ESD). Furthermore, when a selection signal SS is not outputted from the last-stage gate driver 11 in the gate driver group not to be driven and a feedback signal RS is not inputted to the GOUT terminal, it is not possible to detect that this gate driver group is operating normally.

In the present embodiment, output control circuits are configured so as to enable detection of whether gate driver groups not to be driven are normal.

Figure 7A:
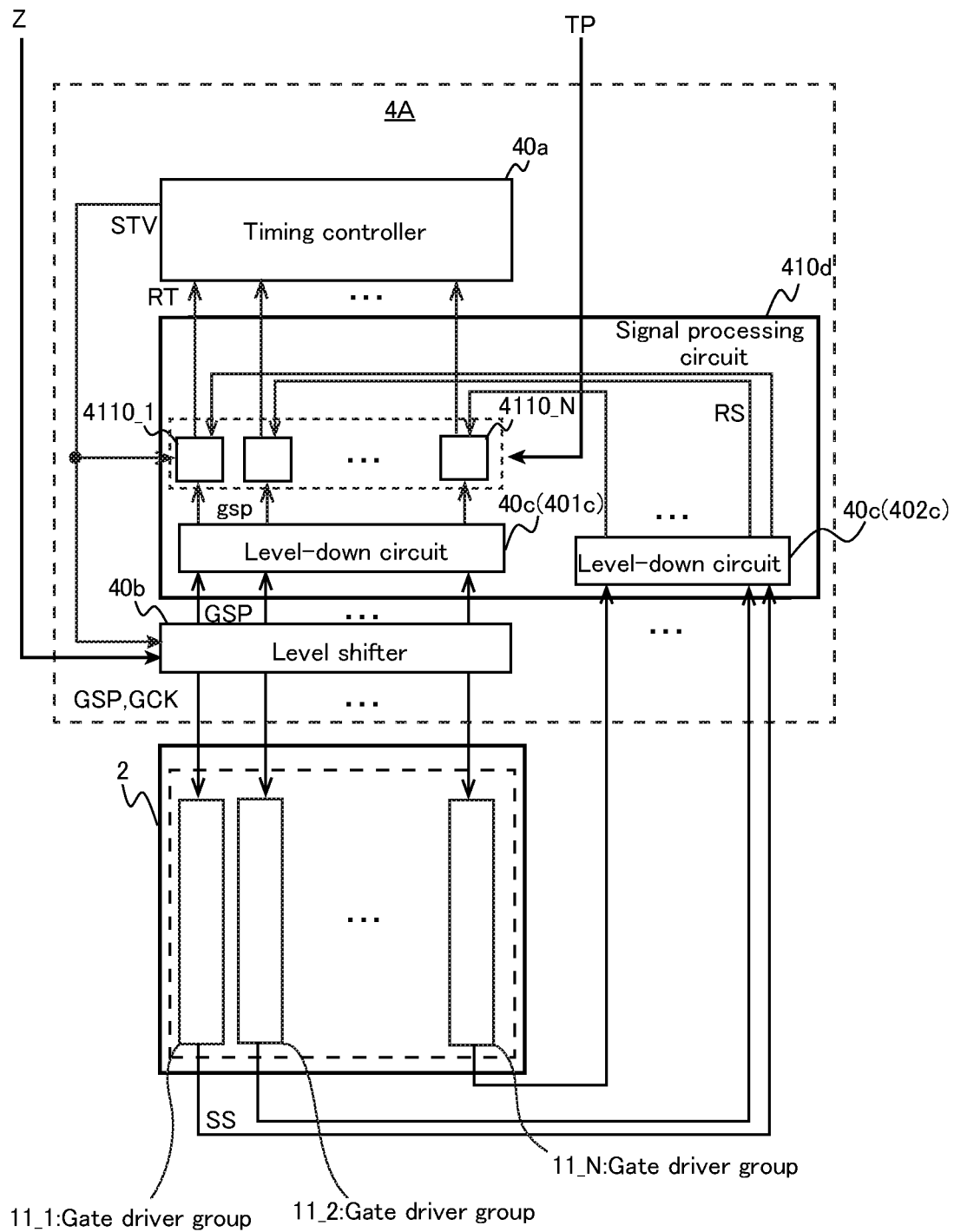
FIG. 7A is a block diagram showing a display control circuit and a display panel in a second embodiment.

FIG. 7A is a block diagram showing a display control circuit and a display panel in a liquid crystal display device of the present embodiment. In FIG. 7A, the same components as those in the first embodiment are given the same reference numerals. In the following, the configuration of the second embodiment different from that of the first embodiment will be described.

As shown in FIG. 7A, a signal processing circuit 410d in the present embodiment includes output control circuits 4110 (4110_1 to 4110_N) provided for respective gate driver groups. To the signal processing circuit 410d, a pulse signal (TP) is inputted from an external circuit (not shown), in addition to a timing signal STV inputted from a timing controller 40a. The pulse signal is a signal whose potential shifts to an H level when the potential of the timing signal STV is at an H level. The pulse signal is a signal such that, when a gate driver group operates normally and an H level selection signal SS is outputted from a last-stage gate driver 11 in the gate driver group at an appropriate timing, the potential of the pulse signal reaches an H level within the output period of the selection signal SS.

Figure 7B:
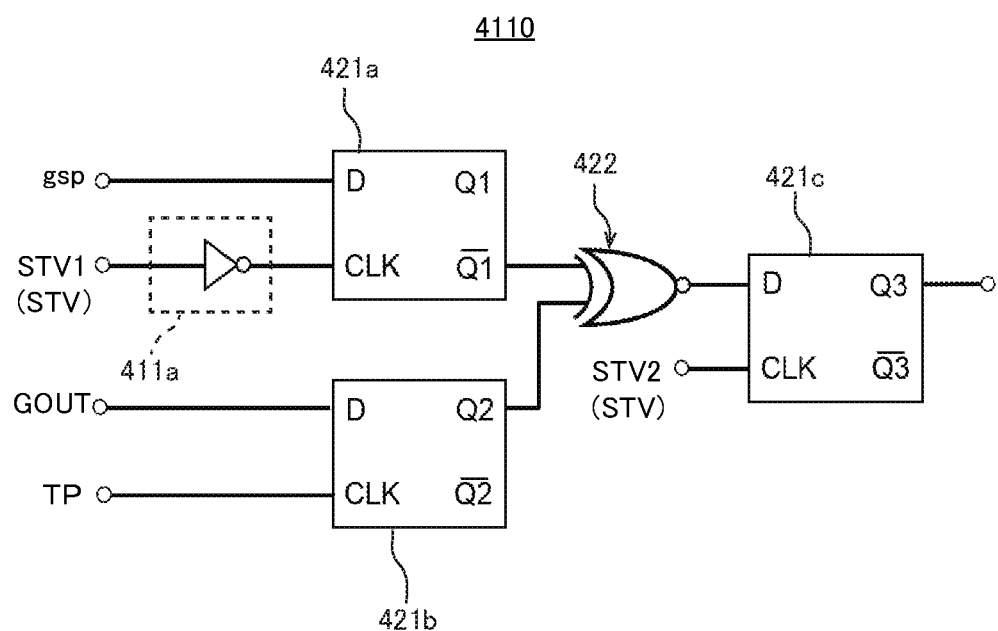
FIG. 7B shows an example of a circuit configuration of an output control circuit shown in FIG. 7A.

FIG. 7B shows an example of a circuit configuration of the output control circuit 4110. As shown in FIG. 7B, the output control circuit 4110 is constituted by combining a NOT circuit 411a, D flip-flop circuits 421a to 421c, and an XNOR circuit 422.

The NOT circuit 411a inputs an inverted signal of a timing signal STV inputted from an STV1 terminal to a CLK terminal of the D flip-flop circuit 421a.

In the D flip-flop circuit 421a, a gate start pulse is inputted to a D terminal, and a ¬Q1 (negation of Q1) terminal is connected to one of input terminals of the XNOR circuit 422.

In the D flip-flop circuit 421b, a D terminal is connected to a GOUT terminal, a CLK terminal is connected to a TP terminal, and a Q2 terminal is connected to the other input terminal of the XNOR circuit 422. To the TP terminal, a pulse signal whose potential shifts to an H level at a timing when a feedback signal RS inputted to the GOUT terminal shifts to an H level is inputted.

In the D flip-flop circuit 421c, a D terminal is connected to an output terminal of the XNOR circuit, a CLK terminal is connected to a STV2 terminal, and a Q3 terminal is connected to the timing controller 40a. The STV2 terminal is connected to the timing controller 40a, and the above-described timing signal STV is inputted to the STV2 terminal. In the present embodiment, a signal outputted from the Q3 terminal is an error detection signal that indicates whether the corresponding gate driver group is operating normally. In this example, when the gate driver group is operating normally, the potential of the error detection signal is at an L level, and when the gate driver group is not operating normally, the potential of the error detection signal is at an H level.

Figure 8:
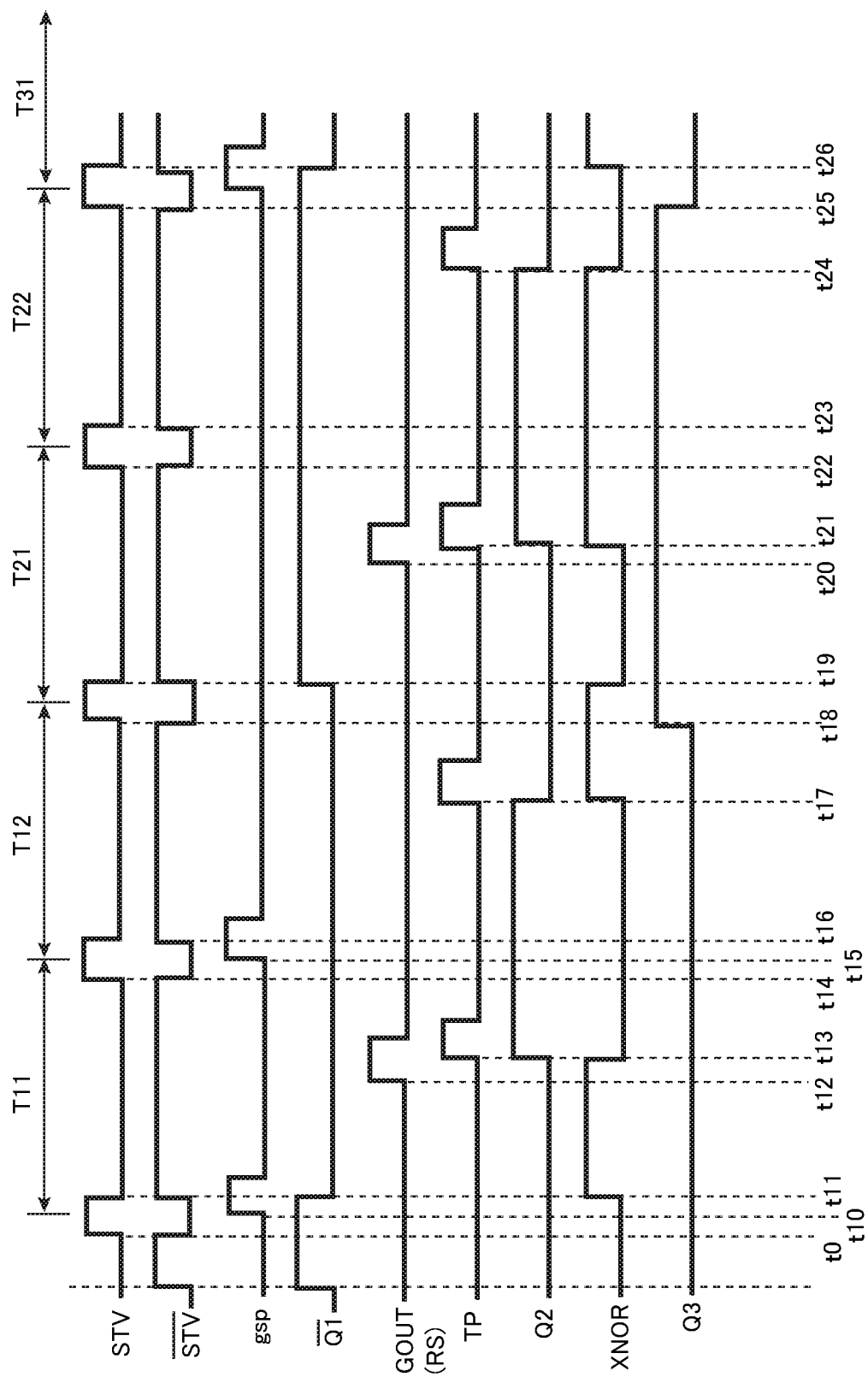
FIG. 8 is a timing chart illustrating an operation of the output control circuit shown in FIG. 7B.

FIG. 8 is a timing chart illustrating an example of an operation of the output control circuit 4110_1 corresponding to one gate driver group 11_1. In FIG. 8, periods T11 to T12 (two frame periods) are driving periods of the gate driver group 11_1, and periods T21 to T22 (two frame periods) are driving pause periods of the gate driver group 11_1.

In the following, an example where, in the driving periods T11 and T12, the gate driver group 11_1 operates normally in the period T11 and does not operates normally in the period T12 will be described.

When a timing signal STV with an H level potential is inputted from the timing controller 40a at a timing t0 prior to the start of the period T11, an inverted signal ¬STV (negation of the timing signal STV) of the timing signal STV is inputted to the CLK terminal of the D flip-flop circuit 421a by the NOT circuit 411a.

In the period T11, the gate driver group 11_1 is in a driving period. Thus, at the start (t10) of the period T11, a gate start pulse GSP is inputted from the level shifter 40b to the gate driver 11 corresponding to the gate line GL1 in the gate driver group 11_1. Also, a gate start pulse gsp is inputted from a level-down circuit 401c to the output control circuit 4110_1 corresponding to the gate driver group 11_1.

At a timing t11 when the potential of the inverted signal ¬STV shifts from an L level to an H level, the D flip-flop circuit 421a captures the gate start pulse gsp inputted to the D terminal, and outputs an inverted signal of the gate start pulse gsp from the ¬Q1 terminal.

At the timing t11, the potential of the GOUT terminal is at an L level, and also, the potential of the pulse signal inputted to the TP terminal is at an L level. Accordingly, the D flip-flop circuit 421b still maintains the potential (L level) prior to the timing t11.

Thereafter, at a timing t12, a selection signal SS with an H level potential is outputted from the last-stage gate driver 11 in the gate driver group 11_1, and a feedback signal RS obtained by stepping down the voltage of the selection signal SS is outputted from the level-down circuit 402c. Subsequently, at a timing t13, a pulse signal with an H level potential is outputted from the external circuit (not shown). As a result, the feedback signal RS inputted to the D terminal of the D flip-flop circuit 421b is captured by the D flip-flop circuit 421b at the timing t13, and a voltage signal (H level or L level) that indicates the presence or absence of the feedback signal RS is outputted from the Q2 terminal. At the timing t13, the potential of the ¬Q1 terminal is at an L level. Accordingly, the potential of the output terminal of the XNOR circuit 421b is at an L level, and a voltage signal with an L level potential is inputted to the D terminal of the D flip-flop circuit 421c.

The D flip-flop circuit 421c does not capture the voltage signal with an L level potential inputted to the D terminal until a timing when the potential of the timing signal STV inputted to the CLK terminal shifts to an H level. The timing signal STV is inputted from the timing controller 40a at a timing t14, which is prior to the start of the subsequent frame period (period T12). The D flip-flop circuit 421c captures the voltage signal with an L level potential inputted to the D terminal at the timing t14, and outputs an error detection signal with an L level potential from the Q3 terminal. That is, the error detection signal in the period T11 is outputted to the timing controller 40a in the period T12 as the subsequent frame. The timing controller 40a determines that the operation of the gate driver group 11_1 to be driven is normal in the case where the error detection signal with an L level potential is outputted.

When the timing signal STV is inputted at the timing t14, an inverted signal of the timing signal STV is inputted from the NOT circuit 411a to the CLK terminal of the D flip-flop circuit 421a. The period T12 is a driving period of the gate driver group 11_1. Thus, at the start (t15) of the period T12, a gate start pulse GSP is inputted to the gate driver 11 corresponding to the gate line GL1 in the gate driver group 11_1, and a gate start pulse gsp is inputted to the output control circuit 4110_1. At a timing t16 when the potential of the inverted signal (¬STV) of the timing signal STV shifts to an H level, the D flip-flop circuit 421a captures the gate start pulse gsp inputted to the D terminal, and outputs an inverted signal of the gate start pulse gsp from the ¬Q1 terminal.

At the timing t16, the potential of the GOUT terminal is at an L level, and also, the potential of the pulse signal inputted to the CLK terminal of the D flip-flop circuit 421b is at an L level. The potential of the Q2 terminal of the D flip-flop circuit 421*b* is maintained until a timing when the potential of the pulse signal inputted to the CLK terminal shifts from an L level to an H level. Accordingly, the potential of the output terminal of the XNOR circuit 422 is also at an L level. At this time, since the potential of the timing signal STV inputted to the CLK terminal of the D flip-flop circuit 421*c* is at an L level, the Q3 terminal still maintains the potential (L level) in the previous state.

Thereafter, although a selection signal SS with an H level potential is not outputted from the last-stage gate driver 11 in the gate driver group 11_1, a pulse signal with an H level potential is outputted from the external circuit (not shown) at a timing t17. As a result, the L level potential of the D terminal of the D flip-flop circuit 421*b* is captured, and a voltage signal with an L level potential is outputted from the Q2 terminal. At the timing t17, the potential of the ¬Q1 terminal is at an L level. Accordingly, the potential of the output terminal of the XNOR circuit 421*b* is at an H level, and a voltage signal with an H level potential is inputted to the D terminal of the D flip-flop circuit 421*c*.

The D flip-flop circuit 421*c* captures the voltage signal with an H level potential inputted to the D terminal at a timing t18, which is prior to the start of the subsequent frame period (period T21), and outputs an error detection signal with an H level potential from the Q3 terminal. That is, the error detection signal in the period T12 is outputted to the timing controller 40*a* in the period T12 as the subsequent frame. The timing controller 40*a* determines that the gate driver group 11_1 to be driven is not operating normally in the case where the error detection signal with an H level potential is outputted.

Next, operations during the periods T21 and T22 in which the driving of the gate driver group 11_1 is paused will be described. In this example, the gate driver group 11_1 does not operate normally in the period T21, and operates normally in the period T22.

When the timing signal STV with an H level potential is inputted from the timing controller 40*a* at the timing t18, an inverted signal ¬STV of the timing signal STV is inputted to the CLK terminal of the D flip-flop circuit 421*a* by the NOT circuit 411*a*.

In this example, in the period T21, the gate driver group 11_1 is in a driving pause period. Thus, a gate start pulse GSP is not inputted to the gate driver 11 corresponding to the gate line GL1 in the gate driver group 11_1, and a gate start pulse gsp is not inputted to the output control circuit 4110_1. Consequently, the potential of the D terminal of the D flip-flop circuit 421*a* is at an L level. The D flip-flop circuit 421*a* captures the L level potential of the D terminal at a timing t19 when the potential of the inverted signal ¬STV shifts from an L level to an H level, and outputs the inverted signal with an H level potential from the ¬Q1 terminal.

At the timing t19, the potential of the GOUT terminal is at an L level, and also, the potential of the pulse signal inputted to the TP terminal is at an L level. Consequently, the potential of the D flip-flop circuit 421*b* still remains at the L level. At this time, the potential of the output terminal of the XNOR circuit 422 is at an H level, and the timing signal STV inputted to the CLK terminal of the D flip-flop circuit 421*c* is at an L level. Consequently, the potential of the Q3 terminal of the D flip-flop circuit 421*c* is still maintained at the same H level as that at the timing t18.

Thereafter, at a timing t20, a selection signal SS with an H level potential is outputted from the last-stage gate driver 11 in the gate driver group 11_1. Subsequently, at a timing t21, a pulse signal with an H level potential is outputted from the external circuit (not shown). As a result, the feedback signal RS inputted to the D terminal of the D flip-flop circuit 421*b* is captured by the D flip-flop circuit 421*b* at the timing t21, and a potential at an H level is outputted from the Q2 terminal. At the timing t21, the potential of the ¬Q1 terminal is at an H level. Consequently, the potential of the output terminal of the XNOR circuit 421*b* is at an H level, and a voltage signal with an H level potential is inputted to the D terminal of the D flip-flop circuit 421*c*.

The timing signal STV is inputted to the CLK terminal of the D flip-flop circuit 421*c* at a timing t22 prior to the start of the subsequent frame period (period T21), and the D flip-flop circuit 421*c* captures the voltage signal with an H level potential inputted to the D terminal, and outputs from the Q3 terminal the voltage signal as an error detection signal. In this case, the gate driver group 11_1, which is not supposed to be driven, is operating, and the selection signal SS with an H level potential is outputted from the last-stage gate driver 11. Consequently, it is determined that the gate driver group 11_1 is not in a normal state.

When the timing signal STV is inputted at the timing t22, an inverted signal of the timing signal STV is inputted from the NOT circuit 411*a* to the CLK terminal of the D flip-flop circuit 421*a*. In this example, the period T22 is a driving pause period of the gate driver group 11_1. Thus, a gate start pulse GSP is not inputted to the gate driver group 11_1, and a gate start pulse gsp is not inputted to the output control circuit 4110_1. Consequently, the potential of the D terminal of the D flip-flop circuit 421*a* is at an L level. The D flip-flop circuit 421*a* captures the L level potential of the D terminal at a timing t23 when the potential of the inverted signal ¬STV shifts from an L level to an H level, and outputs the inverted signal with an H level potential from the ¬Q1 terminal. Also at this time, the potential of the GOUT terminal is maintained at an L level, and the potential of the Q2 terminal is maintained at an H level. Thus, the potential of the output terminal of the XNOR circuit 421*b* is maintained at an H level.

Thereafter, a selection signal SS with an H level potential is not outputted from the last-stage gate driver 11 in the gate driver group 11_1, and at a timing t24, a pulse signal with an H level potential is outputted from the external circuit (not shown). As a result, the L level potential of the D terminal of the D flip-flop circuit 421*b* is captured by the D flip-flop circuit 421*b* at the timing t24, and a voltage signal with an L level potential is outputted from the Q2 terminal. At the timing t24, the potential of the ¬Q1 terminal is at an H level. Consequently, the potential of the output terminal of the XNOR circuit 421*b* is at an L level, and a voltage signal with an L level potential is inputted to the D terminal of the D flip-flop circuit 421*c*.

The timing signal STV is inputted to the CLK terminal of the D flip-flop circuit 421*c* at a timing t25 prior to the start of a subsequent frame period T31, and the D flip-flop circuit 421*c* outputs from the Q3 terminal the L level potential of the D terminal as an error detection signal. In the case where the timing controller 40*a* acquires a detection signal with an L level potential from the output control circuit 4110_1 corresponding to the gate driver group 11_1 in a pause state, the timing controller 40*a* determines that the gate driver group 11_1 is in a normal state.

In the above-described first embodiment, it is not possible to detect whether the gate driver groups in a pause state are normal because only a feedback signal RS, which obtained by stepping down the selection voltage from the last-stage gate driver 11 in the gate driver group to be driven, is outputted to the timing controller 40*a* as a feedback signal RT. In contrast, in the second embodiment, on the basis of the selection voltages from the last-stage gate drivers 11 in both the gate driver group to be driven and the gate driver groups not to be driven and the gate start pulse GSP to these gate driver groups, it is possible to detect whether the gate driver groups are operating normally.

Modified Examples

Although the embodiments of the present invention have been described above, the embodiments of the present invention are not limited to the above-described specific examples and may be modified in various ways.

Figure 9:
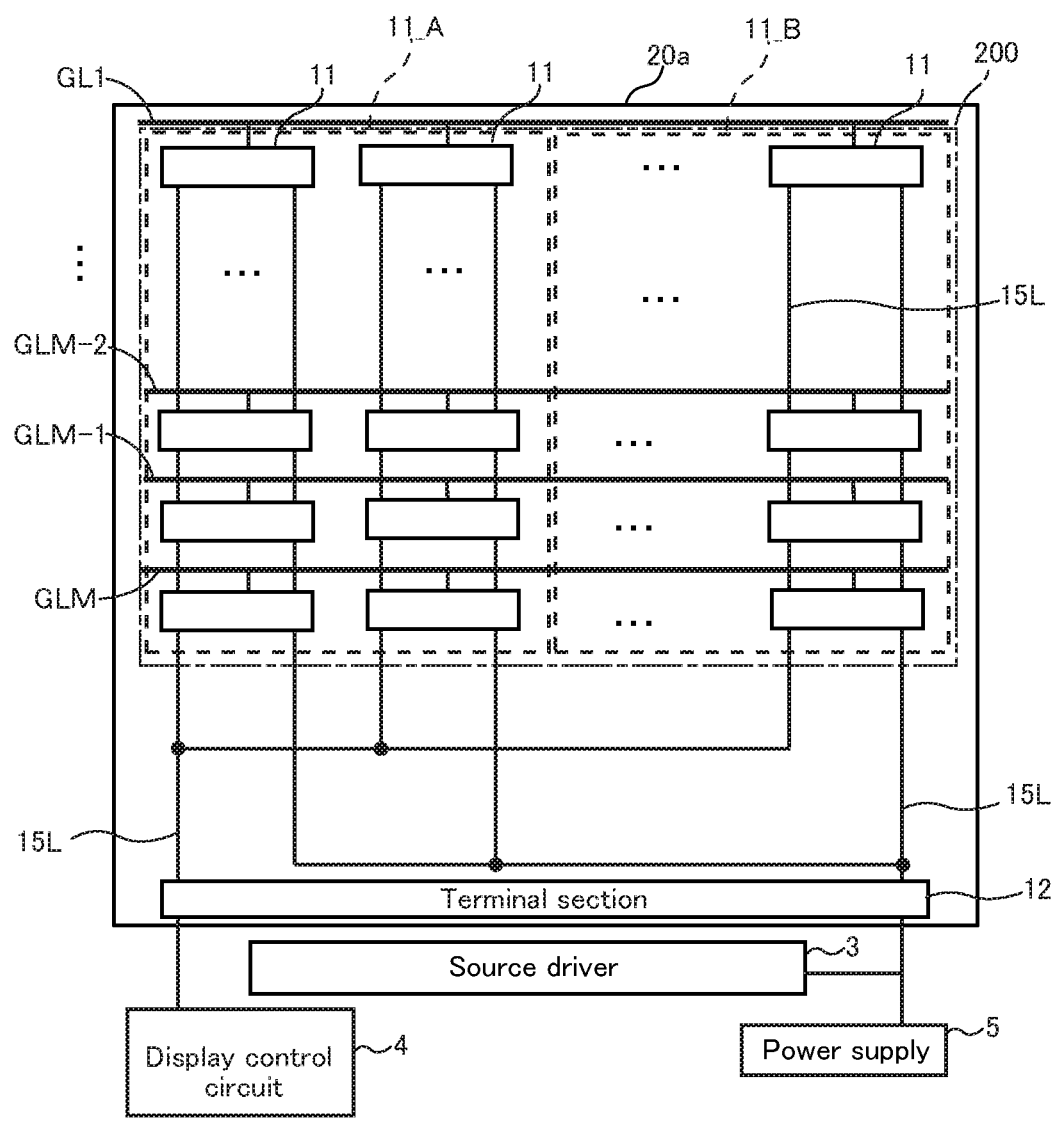
FIG. 9 is a top view showing an example of a configuration of gate driver groups in a modified example (1).

(1) The above-described embodiments are each directed to an example where each of the gate driver groups 11_1 to 11_N includes one gate driver 11 provided for each of the gate lines GL1 to GLM. However, the configuration of the gate driver groups is not limited thereto. As shown in FIG. 9, in gate driver groups 11_A and 11_B, a plurality of gate drivers may be provided for driving each gate line. In this case, there are a plurality of last-stage gate drivers 11 in each of the gate driver groups. Accordingly, the display device may be configured such that, among the plurality of last-stage gate drivers 11, a selection voltage of at least one of the last-stage gate drivers 11 is inputted to the GOUT terminals of the output control circuits 411 and 411O.

(2) Although the above embodiments are each directed to an example where the display panel is rectangular, the shape of the display panel is not limited to a rectangular shape and the display panel may be in any shape. By disposing circuit elements constituting gate drivers in a display region, the lengths of gate lines can be set so as to be partially different from each other. This allows the shape of end portions in the width direction (X direction shown in FIG. 2) of the display panel to be designed freely. With this configuration, a display panel of an oval shape, a semicircular shape, or the like can be realized, for example.

(3) Although the above embodiments are each directed to an example where all the circuit elements constituting the gate drivers are disposed in the display region, the display device may be configured such that some of the circuit elements constituting the gate drivers are provided in a frame region outside the display region.

What is claimed is:

1. A display device comprising:
a display panel that includes a plurality of gate lines and a plurality of source lines;
gate line driving circuitry that includes a plurality of gate drivers provided for each of the plurality of gate lines;
a control circuit that controls the gate line driving circuitry; and
a signal processing circuit that is provided between the gate line driving circuitry and the control circuit,
wherein at least one of circuit elements defining the plurality of gate drivers provided for each of the plurality of gate lines are provided in a display region of the display panel,
the control circuit supplies a control signal that indicates a gate line scanning timing to at least one of the plurality of gate drivers corresponding to, among the plurality of gate lines, a gate line to be scanned first in a unit period in which the plurality of gate lines are scanned,
in the gate line driving circuitry, the gate driver to which the control signal has been supplied is driven on the basis of the control signal, and the gate drivers in stages subsequent to the gate driver to which the control signal has been supplied are each driven on the basis of a scanning signal of the gate driver in a stage preceding thereto,
the signal processing circuit outputs, on the basis of a scanning signal of at least one of the plurality of gate drivers corresponding to, among the plurality of gate lines, a gate line to be scanned last in the unit period and the control signal, a detection signal that indicates whether the gate driver is operating normally, and
each of the plurality of gate lines is connected to more than one gate driver among the plurality of gate drivers.

2. The display device according to claim 1, wherein:
the control circuit has a first drive mode in which, for each of the gate lines, at least one of the plurality of gate drivers corresponding to the each of the plurality of gate lines is driven in the unit period and a second drive mode in which, for each of the gate lines, all the plurality of gate drivers corresponding to the each of the plurality of gate lines are driven in the unit period, and
the first drive mode and the second drive mode are switched for every unit period or for every two or more unit periods.

3. The display device according to claim 2, wherein the control circuit changes, among the plurality of gate drivers provided for each of the gate lines, a gate driver to be driven in the first drive mode for every unit period or for every two or more unit periods.

4. The display device according to claim 1, wherein at least one of the plurality of gate drivers corresponding to the each of the plurality of gate lines is not driven in the unit period in the first drive mode.

5. The display device according to claim 1, wherein:
the gate line driving circuitry includes plurality of gate driver groups,
each of the plurality of gate driver groups includes at least two of the plurality of gate drivers, and
in each of the plurality of gate driver groups, one gate driver to drive one of the plurality of gate line is connected to another gate driver to drive another adjacent gate line via signal wires, respectively.

6. The display device according to claim 5, wherein:
the control circuit has a first drive mode in which, at least one of the plurality of gate driver groups is driven in the unit period and a second drive mode in which, all the plurality of gate drivers groups are driven in the unit period,
the first drive mode and the second drive mode are switched for every unit period or for every two or more unit periods, and
at least one of the plurality of gate driver groups is not driven in the unit period in the first drive mode.

7. A display comprising:
a display panel that includes a plurality of gate lines and a plurality of source lines;
gate line driving circuitry that includes a plurality of gate drivers provided for each of the plurality of gate lines;
a control circuit that controls the gate line driving circuitry; and
a signal processing circuit that is provided between the gate line driving circuitry and the control circuit,
wherein at least one of circuit elements defining the plurality of gate drivers provided for each of the plurality of gate lines are provided in a display region of the display panel,
the control circuit supplies a control signal that indicates a gate line scanning timing to at least one of the plurality of gate drivers corresponding to, among the plurality of gate lines, a gate line to be scanned first in a unit period in which the plurality of gate lines are scanned, in the gate line driving circuitry, the gate driver to which the control signal has been supplied is driven on the basis of the control signal, and the gate drivers in stages subsequent to the gate driver to which the control signal has been supplied are each driven on the basis of a scanning signal of the gate driver in a stage preceding thereto, the signal processing circuit outputs, on the basis of a scanning signal of at least one of the plurality of gate drivers corresponding to, among the plurality of gate lines, a gate line to be scanned last in the unit period and the control signal, a detection signal that indicates whether the gate driver is operating normally, the control circuit has a first drive mode in which for each of the gate lines, at least one of the plurality of gate drivers corresponding to the each of the gate lines is driven in the unit period and a second drive mode in which, for each of the gate lines, all the plurality of gate drivers corresponding to the each of the gate lines are driven in the unit period, the first drive mode and the second drive mode are switched for every unit period or for every two or more unit periods, and in the first drive mode, the signal processing circuit outputs, on the basis of scanning signals of all the plurality of gate drivers corresponding to the gate line to be scanned last in the unit period and the control signal, a signal that indicates whether the gate drivers not to be driven are normal as the detection signal.

8. A display device comprising:

a display panel that includes a plurality of gate lines and a plurality of source lines;

gate line driving circuitry that includes a plurality of gate drivers provided for each of the plurality of gate lines;

a control circuit that controls the gate line driving circuitry; and a signal processing circuit that is provided between the gate line driving circuitry and the control circuit, wherein at least one of circuit elements defining the plurality of gate drivers provided for each of the plurality of gate lines are provided in a display region of the display panel, the control circuit supplies a control signal that indicates a gate line scanning timing to at least one of the plurality of gate drivers corresponding to, among the plurality of gate lines, a gate line to be scanned first in a unit period in which the plurality of gate lines are scanned, in the gate line driving circuitry, the gate driver to which the control signal has been supplied is driven on the bask of the control signal, and the gate drivers in stages subsequent to the gate driver to which the control signal has been supplied are each driven on the basis of a scanning signal of the gate driver in a stage preceding thereto, the signal processing circuit outputs, on the basis of a scanning signal of at least one of the plurality of gate drivers corresponding to, among the plurality of gate lines, a gate line to be scanned last in the unit period and the control signal, a detection signal that indicates whether the gate driver is operating normally, the signal processing circuit further includes a booster circuit that outputs a boosted signal obtained by boosting a voltage of the control signal to a predetermined voltage to the gate drivers corresponding to the gate line to be scanned first, and a step-down circuit that outputs a step-down signal obtained by stepping down a voltage of a scanning signal of at least one of the plurality of gate drivers corresponding to the gate line to be scanned last, and the signal processing circuit outputs the detection signal on the basis of the step-down signal and the control signal.

\* \* \* \* \*